US006853032B2

United States Patent
Ballantine et al.

(10) Patent No.: US 6,853,032 B2
(45) Date of Patent: Feb. 8, 2005

(54) STRUCTURE AND METHOD FOR FORMATION OF A BLOCKED SILICIDE RESISTOR

(75) Inventors: Arne W. Ballantine, Cold Spring, NY (US); Donna K. Johnson, Underhill, VT (US); Glen L. Miles, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/729,379

(22) Filed: Dec. 8, 2003

(65) Prior Publication Data

US 2004/0135214 A1 Jul. 15, 2004

Related U.S. Application Data

(62) Division of application No. 09/541,091, filed on Mar. 31, 2000, now Pat. No. 6,660,664.

(51) Int. Cl.[7] .............................................. H01L 31/119
(52) U.S. Cl. .................. 257/337; 257/382; 257/384; 257/388; 257/412; 257/413; 257/486; 257/754; 438/791; 438/790; 438/595
(58) Field of Search ................................. 257/377, 382, 257/384, 388, 412, 413, 486, 754, 640, 649, 760, 900; 438/595, 790, 791

(56) References Cited

U.S. PATENT DOCUMENTS

| | | |
|---|---|---|
| 5,013,677 A | 5/1991 | Hozumi |
| 5,185,285 A | 2/1993 | Hasaka |
| 5,376,593 A | 12/1994 | Sandhu et al. |
| 5,445,999 A | 8/1995 | Thakur et al. |
| 5,466,484 A | 11/1995 | Spraggins et al. |
| 5,543,350 A | 8/1996 | Chi et al. |
| 5,629,544 A | 5/1997 | Voldman et al. |
| 5,652,181 A | 7/1997 | Thakur |
| 5,744,841 A | 4/1998 | Gilbert et al. |
| 5,780,331 A | 7/1998 | Liaw et al. |
| 5,939,753 A | 8/1999 | Ma et al. |
| 5,960,289 A | 9/1999 | Tsui et al. |
| 6,171,910 B1 | 1/2001 | Hobbs et al. |
| 6,188,044 B1 | 2/2001 | Lee et al. |
| 6,218,224 B1 | 4/2001 | Lukanc et al. |
| 6,218,260 B1 | 4/2001 | Lee et al. |
| 6,248,628 B1 | 6/2001 | Halliyal et al. |
| 6,475,855 B1 * | 11/2002 | Fishburn ..................... 438/239 |

FOREIGN PATENT DOCUMENTS

| | | |
|---|---|---|
| EP | 847077 | 6/1998 |
| JP | 6151354 | 5/1994 |
| JP | 8130215 | 5/1996 |

\* cited by examiner

Primary Examiner—David Nelms
Assistant Examiner—Long Tran
(74) Attorney, Agent, or Firm—Connolly Bove Lodge & Hutz LLP; William D. Sabo

(57) ABSTRACT

A process of forming a nitride film on a semiconductor substrate including exposing a surface of the substrate to a rapid thermal process to form the nitride film.

4 Claims, 7 Drawing Sheets

STRUCTURE AND METHOD FOR FORMATION OF A BLOCKED SILICIDE RESISTOR

CROSS-RELATED APPLICATION

This application is a divisional application of U.S. patent application Ser. No. 09/541,091, filed Mar. 31, 2000, which issued as U.S. Pat. No. 6,660,664, from which this application claims priority.

FIELD OF THE INVENTION

The present invention relates to a resistor structure for semiconductor devices and a method of forming the resistor structure. In particular, the present invention relates to a structure for formation of a blocked silicide resistor and a method of forming the structure. The present invention also relates to a silicon nitride film. Additionally, the present invention concerns a bipolar transistor structure and method of fabricating the bipolar transistor structure.

BACKGROUND OF THE INVENTION

Circuit components are part of every semiconductor device structure. For example, resistors, capacitors, and other such structures are typically formed on a semiconductor substrate. However, processes for formation of the circuit components are not always compatible with the semiconductor devices formed in and on the semiconductor substrate. Also, as new semiconductor device structures come into existence, existing structures of circuit components and methods of forming the circuit components are not always compatible with the structures of the semiconductor devices. For example, methods for formation of circuit components on a semiconductor substrate may cause alterations to the materials and structures of semiconductor devices previously created in and on a semiconductor substrate.

SUMMARY OF THE INVENTION

The present invention concerns a process of forming a nitride film on a semiconductor substrate including exposing a surface of the substrate to a rapid thermal process to form the nitride film.

Additionally, the present invention relates to a method of forming a resistor. Silicide formation is selectively blocked over a doped polycrystalline silicon region or doped silicon region by forming a region of a silicon nitride film utilizing a rapid thermal chemical vapor deposition (RTCVD) silicon nitride deposition process after formation of device source/drain implants and completion of activation anneals. A contact is formed on either side of the blocked region to form a current path through the blocked region.

Also, the present invention provides a blocked silicide resistor structure. A silicide blocking region including a silicon nitride film is arranged over a region of polycrystalline silicon or doped silicon. The silicon nitride film has been formed by a RTCVD nitride deposition process. A region of a silicide is adjacent opposite sides of the silicon nitride film. A contact overlies each of the adjacent silicide regions. The resistor overlies device source/drain implants.

Furthermore, the present invention also provides a bipolar transistor structure that includes a nitride barrier layer formed by a RTCVD nitride deposition and a CMOS FET structure including a conformal nitride barrier film formed by a RTCVD silicon nitride deposition process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
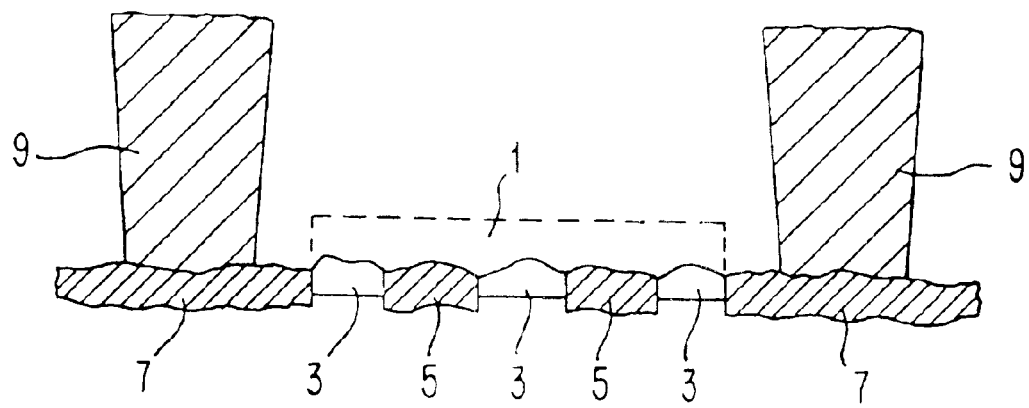
FIG. 1 represents a cross-sectional view of a known structure illustrating the effects of precleaning on the structure.

As discussed above, formation of circuit components can alter the materials and/or the structures of semiconductor device structures form in and on a semiconductor substrate. For example, high temperatures may alter previously carried out source/drain implants. Additionally, steps that might typically be carried out can alter the structure of the circuit component or a structure formed as part of a process of creating a circuit component.

According to one particular example, a blocked silicide resistor structure is formed by locally blocking silicide formation. This can involve blocking any silicide formation. Typically, the silicide is a metal silicide. Examples of typical metal suicides include titanium silicide, cobalt silicide, and platinum silicide. The silicide formation is blocked over a region of doped silicon or doped polycrystalline silicon, typically referred to a poly or poly-Si. After blocking silicide formation, creating a blocked silicide resistor can include positioning a contact on either side of the region with the blocked silicide to form a current path thru the resistor.

As referred to above, formation of electric circuit elements can include processes incompatible with maintaining the integrity of existing semiconductor device structures previously formed in and on a semiconductor substrate. Also, processes necessary for further processing of structures on a semiconductor substrate may be incompatible with structures formed as part of the circuit components. In the example of the blocked silicide resistor, in standard silicon based or silicon-germanium based semiconductor technologies, the formation of the blocked silicide resistor occurs late in the front end of line (FEOL) process, after completion of device source/drain (S/D) implants and activation anneals. This means that the blocked silicide resistor process must be accomplished with minimal thermal budget so as not to upset the existing devices.

This is particularly important because the blocked silicide resistor is typically offered as an option for in particular device structures. If a nitride deposition process were utilized that caused shifts in FEOL implants, then a wafer processed with a blocked silicide resistor processing typically would not have the same transistor characteristics as a wafer processed without the blocked silicide resistor processing. This, then, would mean that the same technology models typically could not be used for wafers with and without the blocked silicide resistor option, thus making such a device impractical as a technology option. Therefore, the present invention provides an important efficiency with respect to marketing and manufacturing concerning the issue of not altering existing devices.

Silicon nitrides are good choices as a silicide blocking film because of their easy integration with the salicide process. However, because the thermal budget is constrained by the prior carrying out of source/drain implants and activation anneals, conventional low pressure chemical vapor deposition (LPCVD) nitride deposition is not acceptable. The current solution has been to use Plasma Enhanced Chemical Vapor Deposition (PECVD) of the silicon nitride.

However, PECVD nitride has other associated problems. For example, while PECVD nitride is formed at a suitably low temperature, PECVD nitride films are generally of lower density, and contain a significant amount of hydrogen. Consequently, HF based salicide precleans are prone to remove large amounts of the PECVD nitride, undermining its effectiveness as a silicide block.

Furthermore, technologies based on titanium silicide are able to use heavily buffered HF solutions that have a lower etch rate of PECVD nitride. However, cobalt silicide technologies require lightly buffered or dilute HF pre-cleans that have an excessive PECVD nitride removal.

An additional disadvantage of the known PECVD silicide blocking process is that the PECVD film does not tend to be very conformal. Along these lines, sidewall depositions are typically about 60% to about 80% the thickness of horizontal surface depositions. This means that when the silicide blocking PECVD nitride is etched to clear horizontal surfaces, spacer nitride films that are underneath the PECVD silicide blocking nitride on the sidewalls of gates will be etched by the silicide blocking nitride etch process. As a result, these nitride films will be pulled down, making the spacer structure less robust at forming a salicide structure.

Nitride films also find importance in bipolar transistor structures. Often, the nitride layers are utilized as barrier layers. As with context described above, formation of the nitride layer can also alter existing structures in a substrate.

As described above, processing associated semiconductor devices formation processes may also conflict with the formation of circuit components. Along these lines, an aggressive preclean process typically required for cobalt silicide etches the currently used PECVD nitride so much that the film can no longer be used to reliably block silicide formation. FIG. 1 illustrates this problem.

Along these lines, FIG. 1 illustrates where a region 1 of PECVD nitride was formed prior to a preclean process. After the preclean process, the nitride was discontinuous as represented by nitride regions 3. As a result, formation of silicide regions 5 occurred in the region their formation should have been blocked. Silicide regions 7 are arranged on opposite sides of the region where silicide formation is to be blocked. A contact 9 has been formed over each silicide region 7.

An alternative to PECVD processes includes conventional furnace low pressure chemical vapor deposition (LPCVD) processes for nitride deposition. Although the films created with LPCVD may have better film quality and would therefore not be etched by the preclean, LPCVD requires a long process cycle time, on the order of about two to about three hours, at temperatures of about 720° C. or higher. For this reason blocked silicide resistors cannot be made by this method without a major redesign of the device to allow for this extra thermal budget or without the silicide block resistor as an option in a technology.

Nitride films may be deposited in other applications. For example, LPCVD nitride films may be deposited processes for forming bipolar transistors. In such cases, it is desirable to reduce the thermal cycle to reduce outdiffusion of the boron profile of the structure.

Nitride films are useful in general after carrying out the "front end of line" (FEOL) process steps, such as steps utilized to create thin film structures that form transistors. Along these lines, it is typically required to deposit a capping nitride layer. This capping layer, often referred to as a "barrier nitride", acts as a diffusion barrier for "back end of line" (BEOL) and "middle of line" (MOL) metal materials and associated contaminants that are used for device contacting and contact formation processing.

The barrier layer may also provide integration advantages for formation of a first layer of contacts. The contact typically must come down and contact structures of different heights. Such structures can include diffusion regions, polysilicon gates, and/or the different structures of a bipolar transistor, such as reach-through contact, base contact, and emitter contact, all of which are also at different heights.

Since the fill material over the barrier nitride is typically a doped glass material, an etch that stops on nitride can be used to etch down the structures that are of different heights. Then, a nitride etch can be used to etch through the nitride. In this case, the nitride typically has a consistent thickness everywhere.

State of the art thin film processing for barrier nitride creation typically utilizes plasma enhanced chemical vapor deposition (PECVD) processing. Two different process regimes have been explored. According to one regime, the deposition of the process is carried out at about 480° C. The other regime involves a slightly improved process where the deposition is carried out at 550° C. With both of these processes, however, conformality of the deposited film is non-ideal, with significantly less deposition on vertical structures than on horizontal structures.

Conformality of the barrier nitride over shallow trench isolation (STI) regions is a major consideration in a properly designed diffusion contact. Poor conformality over the STI divot has been shown to contribute to high parasitic leakage current from contact plug to substrate. Typically, this arises when a partially landed contact hole is etched, causing punch-thru into the isolation through the thin barrier nitride over the STI divot, the dip in the STI fill material that is found near the edge of the isolation trench. Subsequent contact fill results in a parasitic contact to the well or substrate in place of the desired ohmic contact to diffusion.

The present invention utilizes enhancements in rapid thermal processing technology, employing a rapid thermal chemical vapor deposition (RTCVD) process that takes place at temperatures similar or the same as a standard batch furnace. However, RTCVD processes according to the present invention include very short times at peak temperature. The process of the present invention may be utilized in any of the above applications or any other application.

In the case of silicon nitride, the present invention makes use of rapid thermal nitride deposition processes that can deposit films on the order of about 35 Å to about 400 Å with a total exposure to temperatures above 700° C. of 2 minutes or less. Also, the film quality and hydrogen content of these RTCVD nitride film according to the present invention is significantly better than that of PECVD nitride films. The short time at high temperature according to the processes of the present invention allows such a process to be implemented without causing excess diffusion of device implants.

Unlike a PECVD deposited film, an rapid thermal chemical vapor deposition (RTCVD) film according to the present invention resists the preclean, having a low etch rate in lightly buffered hydrofluoric acid (HF). Also, unlike LPCVD, a film according to the present invention has a short time at the maximum temperature. Also, a film according to the present invention will allow for the construction of a blocked silicide resistor on cobalt silicide technologies without any alteration of the device.

In terms of thermal budget, LPCVD>RTCVD>PECVD. In other words, LPCVD has the greatest thermal budget and PECVD the lowest. However, in terms of HF etch rate, PECVD>RTCVD>LPCVD. So, the LPCVD film is the most dense and from a film quality standpoint may potentially represent the best quality nitride. However, the device cannot withstand the thermal budget required by LPCVD, which has the greatest thermal budget as shown above. RTCVD may be thought of as basically in the middle of the two and providing an acceptable result for both items. In terms of conformality, LPCVD=RTCVD>PECVD. Therefore, with respect to conformality, RTCVD is not in the middle and far surpasses PECVD capabilities.

In other contexts, the present invention can produce other benefits. For example, using a RTCVD nitride barrier layer to replace a nitride barrier layer deposited by LPCVD reduces the exposure to elevated temperatures of a substrate and structures formed therein and thereon. Along these lines, RTCVD nitride films according to the present invention, typically deposited at temperatures described herein, have dry and wet etch rates comparable to LPCVD nitride films. However, the thermal cycle required to deposit a film having a specified thickness is greatly reduced with processes according to the present invention.

Future generations of SiGe hetero-junction bipolar transistors (HBTs), after the insitu boron doped SiGe base been deposited, the less exposure to elevated temperatures, or thermal cycling, the device experiences, the less outdiffusion of the boron profile the device will undergo. Generally, the lesser the outdiffusion, the faster a device will run. Also, for future scaling purposes, an RTCVD nitride film of about 100 Å to about 150 Å will be required with good thickness uniformity and density and which maintains good film integrity under high pressure oxidation, dry etch, and wet etch. Such a film will be valuable to protect the base and to control the emitter size.

In accordance with the above, the present invention provides a process for forming a silicon nitride film on a semiconductor substrate. The silicon nitride film provided a silicide formation blocking film. In the context of the present invention, the silicon nitride film is typically formed on a surface of a polycrystalline silicon region or doped silicon region. The silicon nitride film is formed by exposing a surface of the polycrystalline silicon region or doped silicon region to a RTCVD nitride deposition process.

A film according to the present invention may be formed at a temperature of about 600° C. to about 850° C. According to one example, the temperature is about 700° C. According to another example, the temperature is about 775° C. Factors that can affect the temperature that the process is carried out at include the thermal budget. Along these lines, typically, the lower the temperature that the process may be carried out at, the better, particularly with the silicide blocking resistor, bipolar transistor barrier nitride and transistor barrier nitride discussed herein.

Typically, as the process temperature is lowered, sacrifice deposition rate is sacrificed. In other words, the reactions occur slower at lower temperature. Therefore, while a deposition process might be carried out for about a full 2 minutes at about 700° C., the same film thickness can be deposited in about 1.5 minutes at about 775° C. Unfortunately, for the examples of device structures described herein, such devices typically cannot withstand processing at about 775° C. However, the interrelationship between temperature and process speed is one reason why the 680° C. process typically is currently utilized. It has been found that a temperature of about 700° C. process is the hottest process that the device structures can withstand. Therefore, this represents the quickest possible process that can be carried out.

In the future, tooling may be developed that can conduct the process at higher pressures. This could permit the process to be carried out at about 650° C. without significant loss of process speed. As a result, such a process will probably become highly utilized for RTCVD.

The period of time that the process exposes a substrate to the maximum temperature may vary. Typically, the process is as the name implies, rapid. Along these lines, the period that the maximum temperature is sustained may vary from about 30 seconds to about 5 minutes. Typically, the time is about 2 minutes or less. The period of time that the process is carried may depend upon the desired thickness of the film.

Sometimes, to improve the uniformity across a wafer of the deposition, thermal stabilization steps of about 30 to about 60 seconds may be added to a process prior to reaction gases being flowed into the chamber. These thermal stabilization steps can allow the wafer to equilibrate to a more uniform temperature at all points. Then, when reaction gases are flowed, the reaction rate at all points will be correspondingly more uniform. Typically, if thermal stabilization steps are included in a process, the length of the steps is minimized to help achieve good uniformity and maximum tool throughput. It is conceivable, though, that longer thermal stabilization steps may be added that may increase the required time at temperature.

Other process parameters that may be important in a process according to the present invention include the pressure that the process is carried out at. Along these lines, a process according to the present invention may be carried out at in a processing chamber the pressure in which may be controlled. Along these lines, processes according to the present invention may be carried out at a pressure of about 50 torr to about 250 torr. According to one particular example, the process is carried out at a pressure of about 100 torr.

Additionally, control of the conditions in the processing chamber may include introducing gasses into the processing chamber while the process is being carried out. Examples of the gasses include silane ($SiH_4$), ammonia ($NH_3$), dichlorosilane (DCS), $SiCl_2H_2$, trichlorosilane (TCS) ($SiCl_3H$), and disilane ($Si_2H_6$). The amount of gas introduced into the processing chamber may vary. If silane and ammonia gasses are introduced into the chamber they may be introduced at a ratio of about 40 sccm silane to about 4 slm ammonia, or about 0.04:4. The rate that the gasses may be introduced into the chamber may vary from about 1:50 to about 1:400. According to one particular example, a ratio of about 1:200, $SiH_4$:$NH_3$ is utilized.

Figure 3:
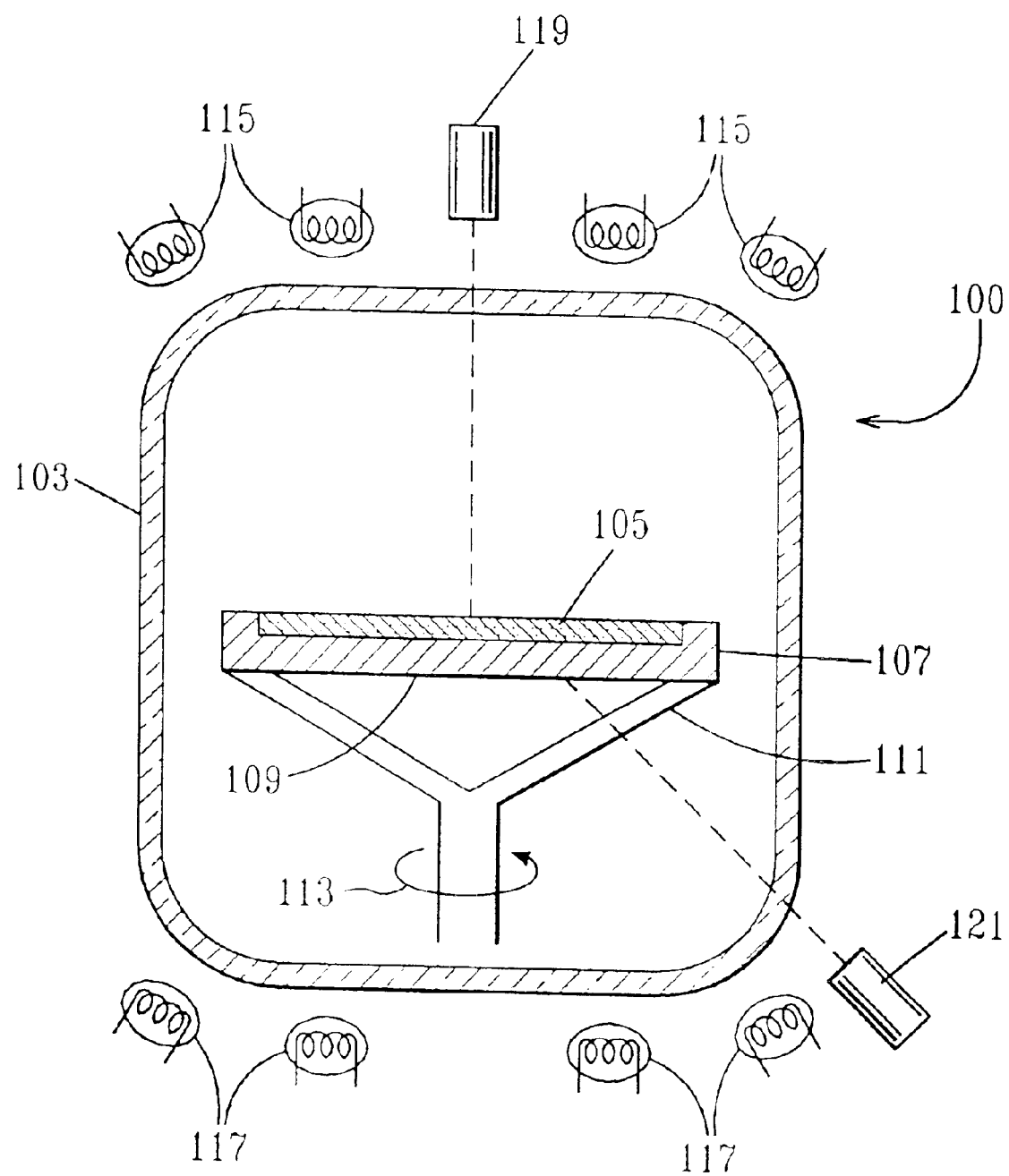
FIG. 3 represents an embodiment of a processing chamber that may be utilized to carry out a process according to the present invention.

FIG. 3 illustrates an example of an apparatus that may be utilized to carry out the present invention. The chemical vapor deposition apparatus 100 illustrated in FIG. 3 includes a processing chamber. The chamber may be lined with a quartz liner.

A substrate 105 to be processed is arranged within the processing chamber. Typically, the substrate is a semiconductor wafer. As stated above, typically, the processing of the wafer has progressed to the point where source/drain implants and activation anneals have been carried out. According to the present invention a single wafer or a plurality of wafers may be arranged within a processing chamber.

A substrate being processed in the chamber may be arranged on a susceptor 109. The susceptor 109 may be supported by support 111. As indicated by arrow 113, the support, susceptor, and substrate being treated may rotate. Rotation is typically carried out in processing to help ensure uniformity of processing. The support, susceptor, and substrate may rotate at a speed of about 0 RPM to about 60 RPM. According to one particular example, the substrate rotates at a speed of about 35 rpm. However, the support, susceptor, and substrate may rotate at any rate to help ensure uniformity of processing.

The interior of the processing chamber may be heated with at least one lamp. Along these lines, at least one lamp may be arranged above and/or below the processing chamber. The embodiment illustrated in FIG. 3 includes a plurality of upper lamps 115 arranged above the processing chamber as well as a plurality of lower lamps 117 arranged below the processing chamber.

Determining whether lamps should be provided above the processing chamber, below the processing chamber or both may depend upon how it is desired the processing be carried out. Typically, the number and arrangement of lamps is designed to help ensure uniform heating of a substrate and processing chamber and also to reduce gas phase nucleation. According to one example, 20 lamps are arranged above the susceptor and 20 lamps are arranged below the susceptor.

The lamps both above and below the chamber may be arranged to further help ensure the desired processing characteristics. For example, in the embodiment described above, which includes 40 lamps, the lamps may be arranged in a circle having a diameter of about 200 mm. The lamps may be further controlled by adjusting the direction that they face. For example, some lamps may be directed toward the center of the susceptor and some may be directed toward the periphery of the susceptor. The lamps could also be directed anywhere between the center and the periphery. According to one particular example, one-half of the lamps are directed toward the center of the susceptor and one-half toward the periphery. The thickness uniformity produced may be tuned by adjusting lamp numbers, arrangement, direction, among other parameters.

The same process could be deposited in a different chamber than described above. For example, an aluminum, cold wall chamber with a resistively heated susceptor could be used to achieve the same results. Electrically heated systems could also be utilized to heat chamber walls or other walls to conductively heat the chamber.

A silicon nitride film formed according to the present invention may have any desired thickness. Typically, the film thickness is sufficient to provide the desired silicide blocking function. According to one example, the film has a thickness of about 100 Å or less. The process conditions may be controlled to result in formation of such a film. those of ordinary skill in the art, once aware of the present disclosure could control the process to result in a desired film without undue experimentation.

As discussed above, the present invention typically is carried out in the context of forming a blocked silicide resistor, such as a silicide blocked resistor. Of course, the present invention may be utilized in any context. In the formation of a resistor, the RTCVD nitride deposition may be carried out. Then, a contact may be formed on either side of a silicon nitride film. The contacts form a current path through the region where silicide formation has been blocked. Also, the material through which the current path is driven typically is formed or doped with prior steps to provide the desired resistance.

The film may be formed with the thickness described above. Along these lines, the process may be carried out with the parameters, such as temperature, pressure, rotation, etc., described above. After formation of the silicon nitride film, a preclean may be carried out. The preclean can include exposing the silicon nitride film, as well as the entire upper surface of the semiconductor structure as exists after formation of the film, to a solution of hydrofluoric acid. The hydrofluoric acid may be lightly buffered or dilute. Those of ordinary skill in the art would know what strength acid to utilized without undue experimentation once aware of the disclosure contained herein.

Utilization of such HF solutions is contrary to known processes that require heavily buffered HF solutions to avoid damaging the silicon nitride film. Along these lines, a RTCVD nitride film according to the present invention is a higher quality film as compared to films formed according to the prior art. The films according to the present invention resist preclean etching, and block all silicide formation in the region of the resistor.

Making a PECVD film thicker to accommodate for the higher etch rate in precleans, which results in the degradation illustrated in FIG. 1, is not a favorable solution since it tends to increase the susceptibility to gate-to-silicon leakage problems. Additionally, PECVD films have a lower wet etch rate. However, they also have a fast rate of deposition, which requires thicker films to maintain thickness control. The present invention does not suffer from these shortcomings.

For example, films formed according to the present invention have excellent wet etch characteristics. In other words, the films will not be easily removed by the wet etch steps. This permits formation of very thin films. According to one example, the present invention permits an silicide blocked resistor to be formed having a thickness of about 120 Å in a cobalt silicide product.

Figure 2:
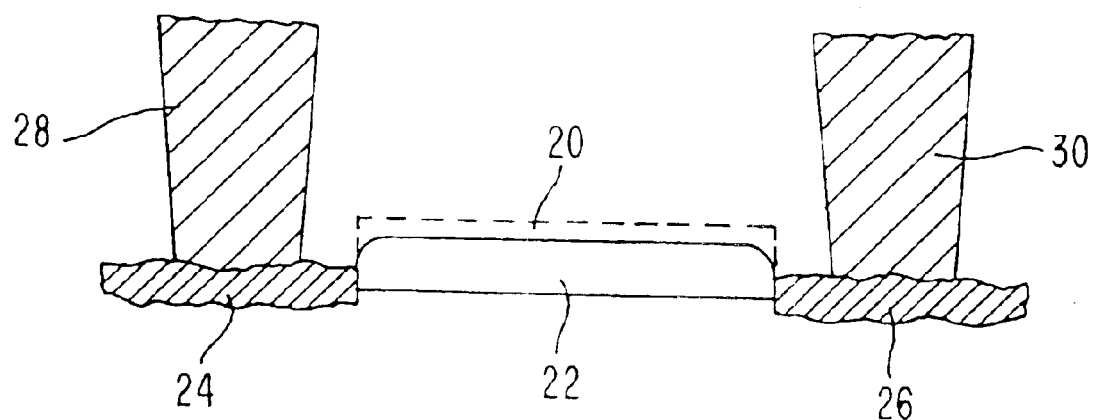
FIG. 2 represents a cross-sectional view of an embodiment of a structure according to the present invention illustrating the effects of precleaning.

FIG. 2 illustrates one embodiment of a film according to the present invention. In FIG. 2, the broken line represents the surface of a silicon nitride layer 20 formed according to the present invention prior to carrying out a preclean process. At this point, the nitride layer typically has a thickness of about 100 Å to about 200 Å. After carrying out a preclean the nitride film 22 has been partially removed. As compared to the prior art film shown in FIG. 1, the film shown in FIG. 2 has maintained its integrity to a much greater degree without any portions entirely removed. Precleaning typically results in the loss of a certain amount of the thickness. According to one example, the loss is about 10 Å to about 50 Å.

FIG. 2 also shows silicide regions 24 and 26 on opposite sides of the nitride film 22. As stated above, silicide regions 24 and 26 may be metal silicides including the specific examples listed above or any other silicide. Contacts 28 and 30 extend up from the silicide regions 24 and 26.

Figure 4:
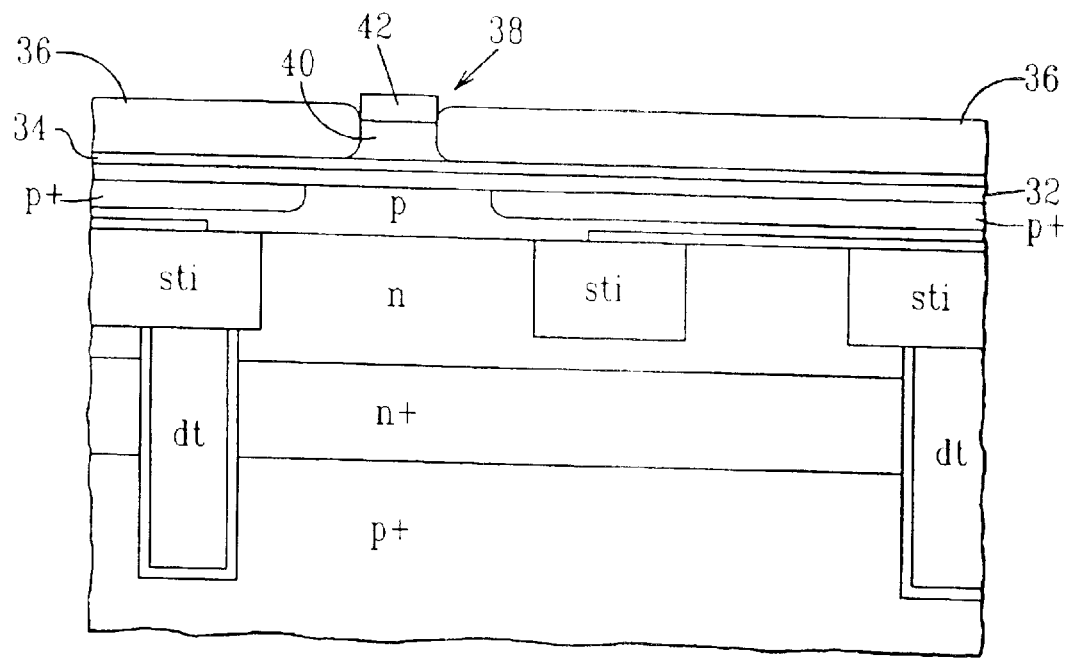
FIGS. 4–6 represent cross-sectional views of an embodiment of a bipolar transistor structure according to the present invention at various stages of an embodiment of a process according to the present invention for forming the structure.

In the context of a nitride barrier structure in a bipolar transistor, after in-situ boron doped base deposition and a sacrificial oxide growth, an RTCVD barrier nitride film may be deposited according to the present invention in place of a LPCVD nitride as is currently carried out. Subsequently, a polycrystalline silicon conversion layer, PECVD nitride region and tetraethyl ortho silicate (TEOS) oxide region may be deposited. Next, the emitter pedestal may be defined by standard photolithography and dry etch process steps. The extrinsic base sidewall may then be defined. After the extrinsic base implant, the TEOS sidewall may be striped. FIG. 4 illustrates the inventor at this stage of the process. Along these lines, FIG. 4 illustrates oxide layer 32, RTCVD nitride layer 34, conversion oxide layer 36, emitter pedestal space 38, filled with polycrystalline silicon 40 and PECVD nitride 42.

Figure 5:
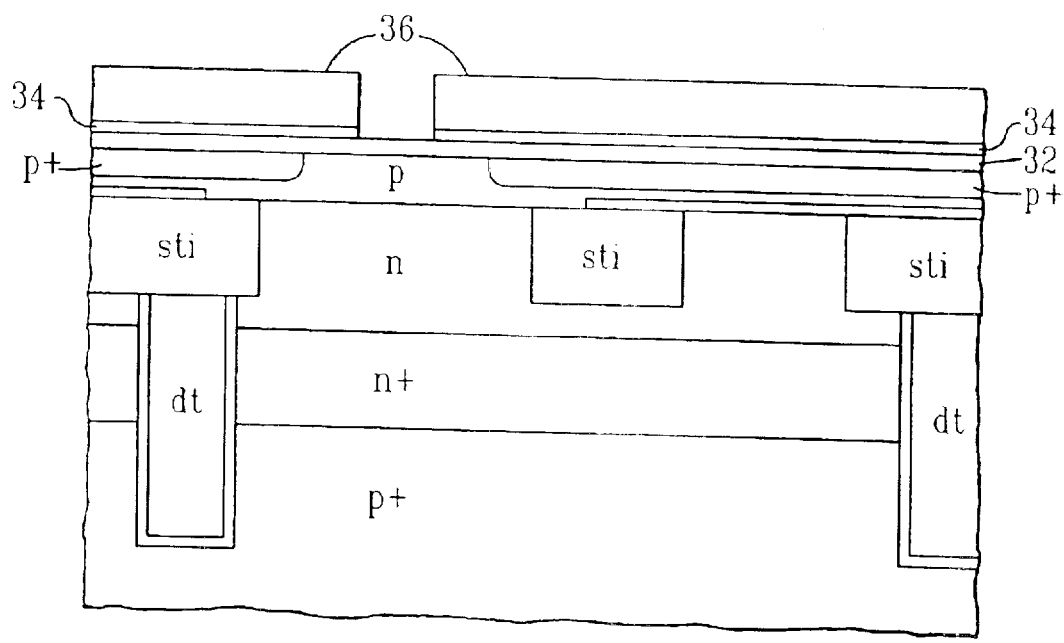

At this stage, the poly layer 36 may be converted to oxide grown on silicon at reduced temperature and elevated pressure to increase reaction rate (HIPOX). Then, the PECVD nitride 42 may be removed. The emitter may then be opened by etching away unconverted poly region 40 and PECVD nitride 42 to result in the structure as shown in FIG. 5.

Figure 6:
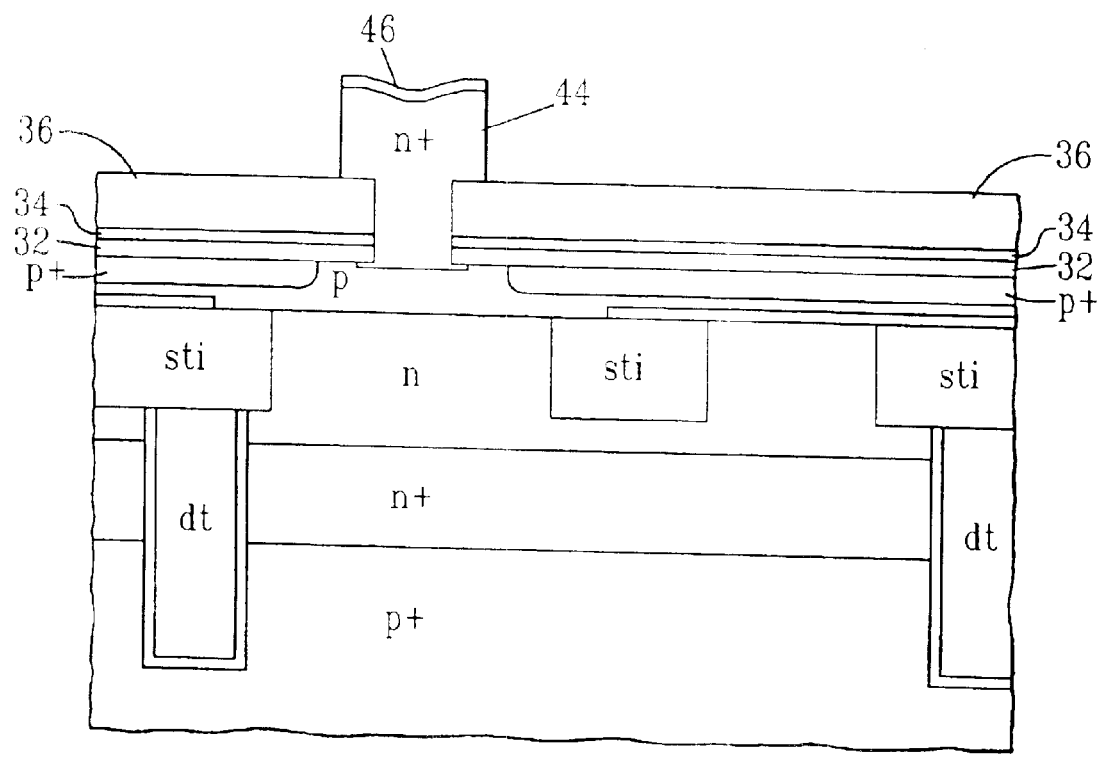

Subsequently, the portion of the sacrificial oxide layer 32 in the emitter region 38 may be removed by a wet etch. Emitter polycrystalline silicon 44 may then be deposited to result in the structure shown in FIG. 6. With the RTCVD barrier nitride in place, the thermal cycle may be reduced to a few minutes at a temperature of about 750° C. or about 700° C., rather than the thermal cycle of about 30 minutes at about 720° C. for an LPCVD barrier nitride. In spite of this, the film maintains good integrity after high-pressure oxidation and dry and wet etches. Of course, any of the temperatures, processing times and/or other parameters described herein may be utilized in the deposition of the RTCVD nitride layer.

According to one particular embodiment, an RTCVD nitride layer was substituted for an LPCVD nitride layer in an NPN transistor. In this application, key NPN transistor electrical parameters that may change due to the RTCVD nitride are summarized in Table 1. As can be seen, the base current and collector current or gain (Beta) of the transistor experience little or no change. The intrinsic (50×50) and extrinsic (51×700) base-emitter junction capacitance showed very little variation as well. If, indeed, a delta exists, the RTCVD nitride thickness can be adjusted to yield the same capacitance as experienced with a LPCVD nitride. Also, as shown in Table 1, utilizing RTCVD increased the yield for the wafers with RTCVD nitride.

TABLE 1

Key NPN Electrical Parameters for Wafers with and without RTCVD Barrier Nitride

| Parameter | Target | LPCVD | RTCVD |
| --- | --- | --- | --- |
| Emitter Delta-w (μm) | −0.02 | 0.01 | 0.04 |
| 4 × 5 μm² Joe (pA/μm²) | −1.75 | −1.40 | −1.46 |
| 0.44 × 3 μm² Base Current (μA) | 20 | 19.3 | 20.3 |
| 0.44 × 3 μm² Collector Current (mA) | 2 | 2.47 | 2.67 |
| 0.44 × 3 μm² Beta | 100 | 126. | 131.7 |
| 50 × 50 E-B Capacitance (fF/μm²) | — | 5.65 | 5.55 |
| 51 × 700 E-B Capacitance (fF/μm²) | — | 0.75 | .778 |
| 4 K Overall Yield (%) | 75 | 81.5 | 90.6 |

As can be seen from the above, utilizing RTCVD nitride in place of a 200 Å LPCVD nitride in the emitter process showed very good results. The yield was improved and the electrical parameters showed little shift as compared to the LPCVD. The small shifts experienced, if statistically valid, could be corrected by photolithography adjustments or thickness adjustments of the RTCVD nitride that are not detrimental to the process or NPN characteristics.

In the context of where a conformal nitride film is desired, the present invention may also be utilized. Along these lines, use of a rapid thermal chemical vapor deposition process permits deposition at higher temperatures. As a result, the present invention provides a more robust and conformal film without significant device diffusion impact that results from use of conventional furnace LPCVD processing. Utilizing an RTCVD process according to the present invention can produce conformalities of greater than about 90%. In some cases, the conformality may be about 95% to about 100%, when measured on both nested and isolated structures.

An RTCVD film according to the present invention is more conformal than LPCVD nitride films. This means that a film according to the present invention will fill divot structures more easily. Additionally, an RTCVD film according to the present invention is also more robust than LPCVD films. This means that films according to the present invention are less apt to have pin-holes or other weak points where an etch might open up a leakage path between contact and substrate. The robustness of films according to the present invention is evidenced by significantly lower wet etch rates that RTCVD nitride wet etch rates experience as compared to PECVD nitride etch rates.

Any process for RTCVD of a nitride, but processes for forming a conformal nitride film in particular, may typically be carried out at a temperature of about 600° C. to about 800° C. Some processes according to the present invention may be carried out between about 700° C. and about 775° C. Other processes according to the present invention may be carried out at temperatures of about 600° C. to about 700° C. Particular embodiments may be carried out at temperatures of about 680° C., about 700° C., or about 700° C. to about 710° C.

Similarly, any process for RTCVD of a nitride, but processes for forming a conformal nitride film in particular, may typically be carried out for a period of time of about 1 minute to about 4 minutes. One particular embodiment is carried out for a time of about 95 seconds. The above times are the times that the process is at a temperature where deposition is occurring, or substantially all of the deposition is occurring. Some deposition may take place at lower temperatures, but the time periods are for the time when substantially all of the deposition is occurring. It is not necessary that the time at temperature be continuous. The temperature could be pulsed.

As described above processes according to the present invention could be carried out in a chamber such as that shown in FIG. 3. The conditions within the chamber can be altered to control the process for depositing the film. Along these lines, pressure and contents of the atmosphere within the chamber may be varied.

The pressure within a processing chamber may be from about 100 torr to about standard pressure (760 torr). According to some embodiments, the pressure is about 250 torr or greater. Two particular embodiments employ pressures of 100 torr and 250 torr. Particular pressures may be utilized in combination with particular temperatures. Along these lines, in some embodiments, pressures of 250 torr or greater may be utilized particularly in combination with processing at temperatures of about 600° C. to about 700° C. Similarly, in some embodiments, pressures of about 100 torr may be utilized in combination with processing temperatures of above 680° C. and above.

Regarding the pressure, typically, the pressure in the processing chamber is about 70 torr to about 120 torr. More typically, the pressure is about 80 torr to about 110 torr. Most typically, the pressure is about 100 torr.

In controlling the composition of the atmosphere within a processing chamber, various gasses may be introduced into the chamber. Along these lines, at least one nitrogen-containing gas may be introduced into the chamber. At least one silicon source gas may also be introduced into the chamber.

One example of a nitrogen source gas that may be introduced into the chamber is ammonia ($NH_3$). According to one embodiment, about 4 liters per minute of $NH_3$ gas is introduced into the processing chamber. Typically, about 3 liters per minute to about 6 liters per minute of ammonia gas may be introduced into the processing chamber. More typically, about 3 liters per minute to about 5 liters per minute of ammonia gas may be introduced into the processing chamber. Still more typically, about 4 liters per minute to about 4 liters per minute of ammonia gas may be introduced into the processing chamber. Among other functions, ammonia gas may be utilized to grow a nucleation layer for the nitride deposition.

Other gasses that may be introduced into the processing chamber include silane gas ($SiN_4$) and nitrogen ($N_2$). Typically, silane gas may be introduced into the processing chamber at a rate of about 4 sccm to about 60 sccm. More typically, silane gas may be introduced into the processing chamber at a rate of about 4 sccm to about 50 scam. Still more typically, silane gas may be introduced into the processing chamber at a rate of about 4 sccm to about 20 sccm. According to one particular embodiment, silane is introduced at a rate of about 40 sccm.

Other gasses that may be utilized include dichlorosilane (DCS) or any of the other gasses discussed above. DCS gas may be utilized in place of $SiH_4$ gas to try to minimize the effect of hydrogen enhanced boron diffusion during the deposition reaction.

Additionally, deuterated gases may be deposited in order to provide a deuterated nitride to improve hot-electron performance. Along these lines, a deuterated silicon source gas may be utilized, such as deuterated DCS or $SiD_4$. A deuterated nitrogen source could be provided by deuterated ammonia ($ND_3$). Deuterated forms of both silicon and nitrogen source gases may be used along with at least one deuterium carrier gas to maximize deuterium concentration in the deposited film.

According to one particular embodiment, a processing temperature of about 700° C. is utilized and a processing temperature of about 100 torr. About 4 1 pm of $NH_3$ and about 40 sccm of $SiH_4$ are introduced into the processing chamber. Nitrogen also introduced into the processing chamber according to this embodiment. When nitrogen is introduced into the chamber, it may be introduced in more than one location. According to this particular embodiment, nitrogen is introduced in a main flow and through a slit. The main nitrogen flow, or $N_2$Main, may be about 4 liters per minute. The slit flow may be about 2 liters per minute. Controlling the two (or more) nitrogen flows relative to each other can help to improve the uniformity of the process.

The substrate is rotated at about 40 rpm. The chamber may be heated such that the amount of heat directed to various regions may be controlled. Along these lines, if lamps are utilized to heat the processing chamber, the lamps may be arranged and controlled in zones. For example, the lamps may be divided into inner, outer, and lower zones. Also, the lamp power may be controlled such that it varies at different stages in the process. Along these lines, the process may have different values during a heat up step, during a period of time that the process according to the present invention is actually occurring, and during a purge stage when gasses are purged from the processing chamber.

Typically, the percent power levels for the lower zone/upper inner zone/lower inner zone during the heat up step are 40–70/30–60/30–60, during the process are 40–70/25–45/25–45, and during the purge step 50/40/40. More typically, the percent power levels for the lower zone/upper inner zone/lower inner zone during the heat up step are 50–60/40–50/40–50, during the process are 50–60/30–40/30–40, and during the purge step 50/40/40. Most typically, the percent power levels for the lower zone/upper inner zone/lower inner zone during the heat up step are 55/45/45, during the process are 55/35/35 or 55/38/38, and during the purge step 50/40/40. The percentages represent percentages of the total lamp out power.

The deposition rate for the most typically example is about 5 Å/sec. The deposition time to produce a barrier nitride film having a thickness of about 500 Å is about 95 seconds.

According to this embodiment, the process recipe may be formatted as a high throughput recipe. According to this embodiment, the wafer is arranged on a hot susceptor having a temperature of about 700° C. to about 710° C. $NH_3$ may then be used to grow a nucleation layer for the nitride deposition. The $SiH_4$ mass flow controller (MFC) may then be stabilized. Next, with $SiH_4$ and $NH_3$ flowing, the deposition occurs. After deposition, $SiH_4$ flow may be stopped. However, $NH_3$ flow may continue for approximately 10 seconds to scavenge any available $SiH_4$ before the chamber is purged with $N_2$ and the wafer is extracted.

Figure 7:
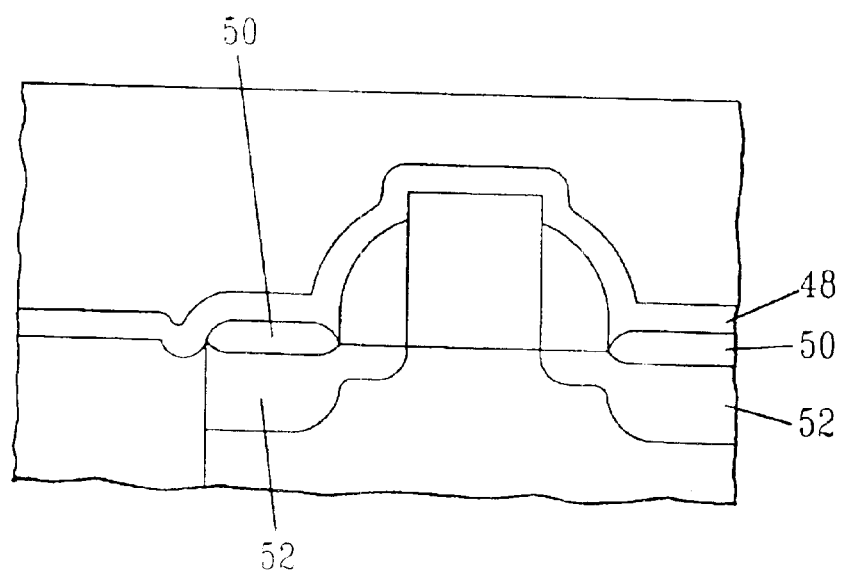
FIG. 7 represents a cross-sectional view of an embodiment of a conformal nitride barrier layer according to the present invention.

FIG. 7 represents a cross-sectional view of an embodiment of a nitride film formed according to the present invention that illustrates the position of the barrier nitride film in standard CMOS FET construction. In FIG. 7, the conformal barrier film 48 is arranged over all of the structures on a substrate, including silicide regions 50 and diffusion regions 52. In bipolar transistor construction, as is typically used in SiGe processing, the barrier nitride is similarly formed as the last step to conformally cap the transistor.

Figure 8:
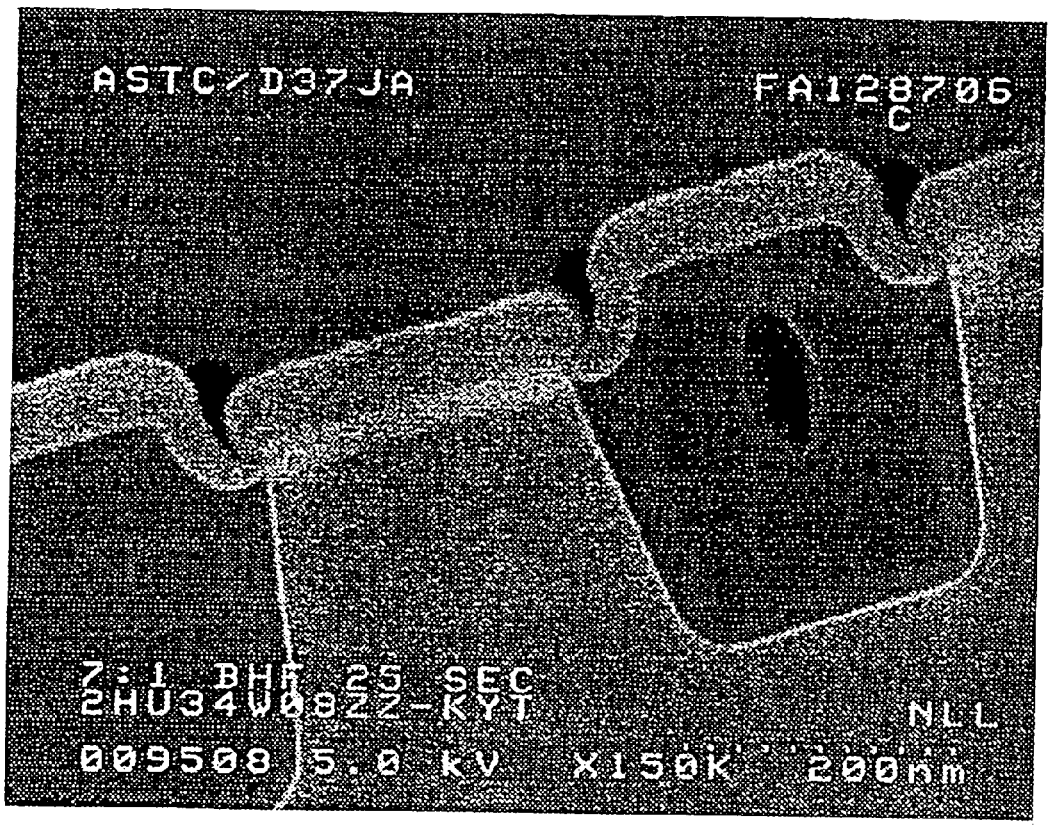
FIG. 8 represents a photomicrograph that illustrates a nitride layer formed according to an embodiment of a known process.
Figure 9:
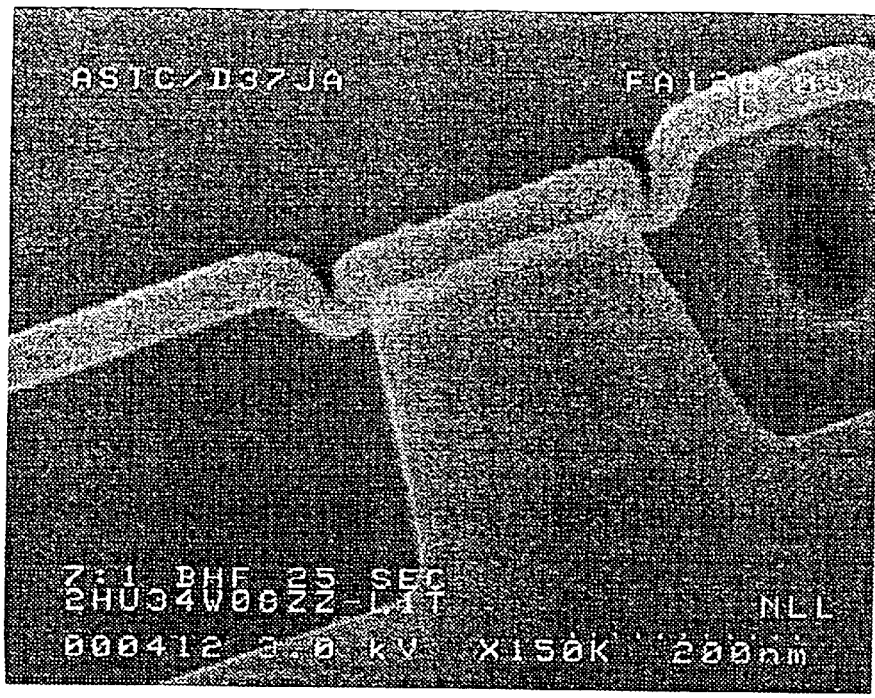
FIG. 9 represents a photomicrograph that illustrates a nitride layer formed according to another embodiment of a known process.

FIG. 8 represents a photomicrograph of a cross-section of a PECVD film deposited at about 480° C. FIG. 8 shows the poor coverage of a divot area with significant thinning in the divot area after an HF decoration of about 25 seconds. Similarly, FIG. 9 represents a photomicrograph of a cross-section of a PECVD film deposited at about 550° C. and illustrates the poor coverage of a divot area with significant but slightly reduced thinning in the divot area after an HF decoration of about 25 seconds.

Figure 10:
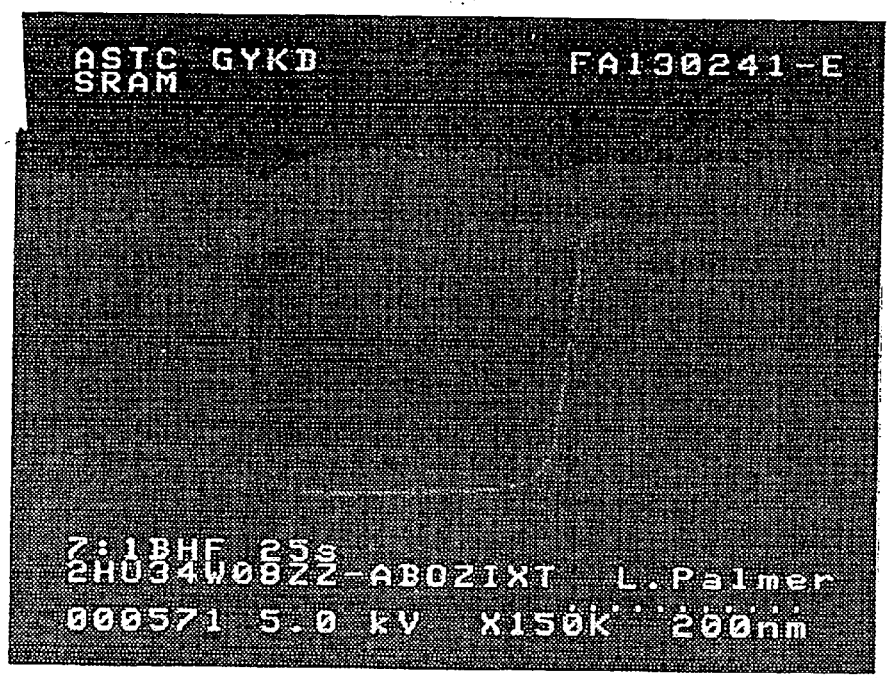
FIG. 10 represents a photomicrograph that illustrates a conformal nitride layer formed according to an embodiment of a process according to the present invention.
Figure 11:
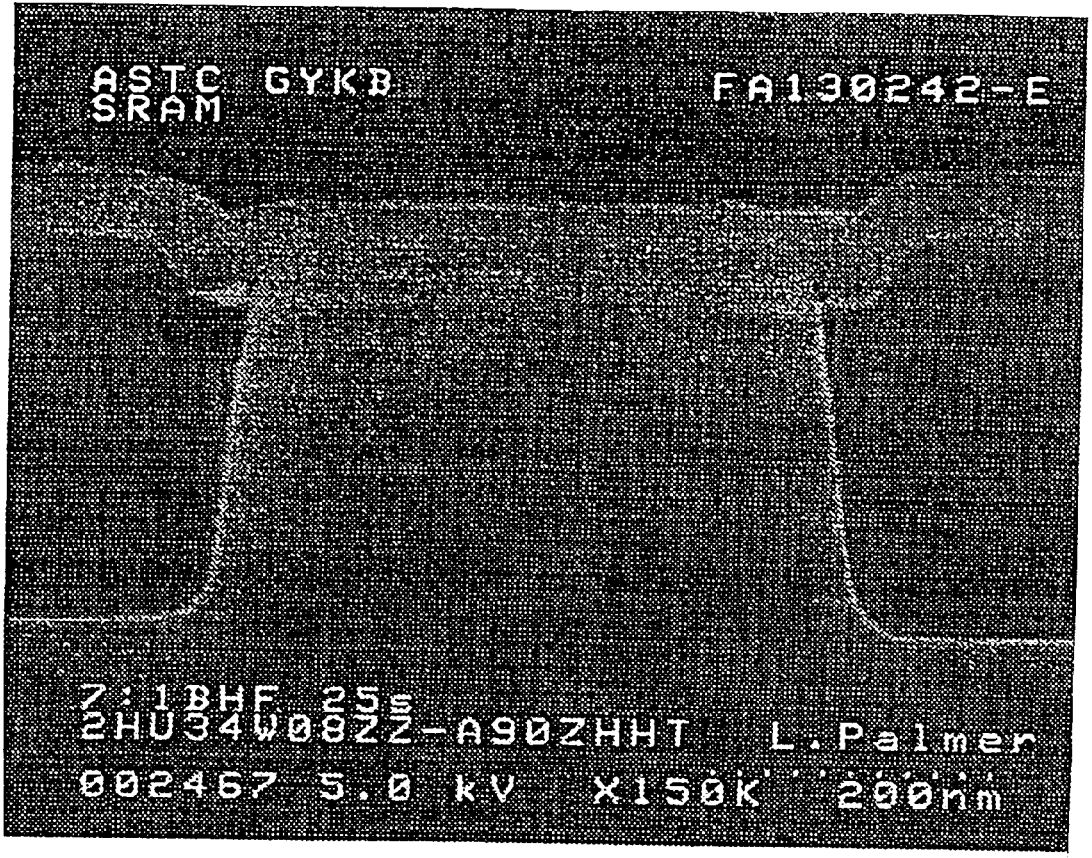
FIG. 11 represents a photomicrograph that illustrates a conformal nitride layer formed according to another embodiment of a process according to the present invention.

FIG. 10 represents a photomicrograph of a cross-section of a RTCVD film according to the present invention deposited at about 700° C. FIG. 10 illustrates the full coverage of a divot area with no thinning in the divot area after an HF decoration of about 25 seconds that may be achieved according to the present invention. Along these lines, FIG. 11 represents a photomicrograph of a cross-section of a RTCVD film deposited at about 775° C. according to the present invention. FIG. 11 demonstrates the full coverage of a divot area with no thinning in the divot area after an HF decoration of about 25 seconds that may be achieved according to the present invention.

In the context of a conformal layer, the present invention can provide a barrier nitride structure formed with a RTCVD process. A structure formed according to the present invention can conformally cover an STI divot, at least more conformally than PECVD. A nitride film structure formed according to the present invention can resist etching more effectively than a PECVD deposited film. While a similar structure may be formed using LPCVD, the LPCVD method does not integrate with CMOS or bipolar processing because of thermal budget as does the process of the present invention.

The structure that the processes of the present invention may deposit a nitride layer on can include polycrystalline or silicon structures. The polycrystalline or silicon structures may have a thin oxide on them. However, the process will still work. Because the RTCVD process according to the present invention is a deposition process that utilizes a gaseous source of nitrogen as the nitrogen source for the nitride, it can deposit nitride on any exposed surface. Along these lines, the present invention can deposit nitride on surface of poly, oxide, single crystal silicon, or even metal.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A blocked metal silicide resistor structure, comprising:
    a silicide blocking region comprising a silicon nitride film arranged over a region of doped polycrystalline silicon or doped silicon, wherein the silicon nitride film has a conformality of greater than about 90%, and is formed by a rapid thermal nitride deposition process at a temperature from about 600° C. to about 775° C.;
    metal silicide structures adjacent to opposite sides of the silicon nitride film with a contact overlying each of the adjacent silicide structures, wherein the resistor overlies device source/drain implants.

2. The resistor structure according to claim 1, wherein the metal silicide is selected from the group consisting of titanium silicide and cobalt silicide.

3. The resistor structure according to claim 1, wherein the silicon nitride film has a thickness of about 100 Å or less.

4. The resistor structure according to claim 1, wherein the resistor structure is formed on cobalt silicide based structures.

* * * * *